(12) United States Patent
Kohno (10) Patent No.: US 6,538,955 B2
(45) Date of Patent: Mar. 25, 2003

(54) SEMICONDUCTOR INTEGRATED CIRCUIT FOR WHICH HIGH VOLTAGE COUNTERMEASURE WAS TAKEN

(75) Inventor: Fumihiro Kohno, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/906,116

(22) Filed: Jul. 17, 2001

(65) Prior Publication Data

US 2002/0024876 A1 Feb. 28, 2002

(30) Foreign Application Priority Data

Aug. 29, 2000 (JP) ........................................ 2000-259108

(51) Int. Cl.$^7$ ................................................. G11C 8/00
(52) U.S. Cl. ..................................... 365/230.6; 326/105
(58) Field of Search ........................ 365/230.6, 230.01; 326/105

(56) References Cited

U.S. PATENT DOCUMENTS

| | | | |
|---|---|---|---|
| 5,777,926 A | | 7/1998 | Trinh et al. |
| 5,870,348 A | * | 2/1999 | Tomishima et al. .......... 365/149 |
| 6,229,384 B1 | * | 5/2001 | Ohsawa ....................... 327/541 |

* cited by examiner

Primary Examiner—Hoai Ho
(74) Attorney, Agent, or Firm—Banner & Witcoff, Ltd.

(57) ABSTRACT

There are provided a plurality of CMOS configured pre-driver circuits, wherein an increased voltage obtained by increasing a power voltage is applied to a source of each P-channel transistor, and a word line driver circuit each having a P-channel transistor and an N-channel transistor to which an output of the pre-driver circuit is inputted. The source of each N-channel transistor in the plurality of pre-driver circuits is connected in common to that of each N-channel transistor in the word line driver circuit, and a source-drain path of an N-channel transistor for voltage alleviation is connected between this source common node and a node of a grounding voltage. The increased voltage is applied to a gate of the N-channel transistor for voltage alleviation.

14 Claims, 9 Drawing Sheets

SEMICONDUCTOR INTEGRATED CIRCUIT FOR WHICH HIGH VOLTAGE COUNTERMEASURE WAS TAKEN

CROSS-REFERENCE TO RELATED APPLICATIONS

This application is based upon and claims the benefit of priority from the prior Japanese Patent Application No. 2000-259108, filed Aug. 29, 2000, the entire contents of which are incorporated herein by reference.

BACKGROUND OF THE INVENTION

1. Field of the Invention

The present invention pertains to a semiconductor integrated circuit that operates a power voltage by an increased voltage. More particularly, the present invention relates to a semiconductor integrated circuit adopted to improve hot carrier durability of an element to which such increased voltage is applied.

2. Description of the Related Art

Recently, in a DRAM (Dynamic Random Access Memory) that is a kind of semiconductor integrated circuit, a high-level signal in a word line is raised to a voltage higher than a power voltage, thereby achieving high speed data readout and write operations. The high-level signal of the word line signal is set to an increased voltage that is higher than the power voltage, whereby a high voltage is applied to a gate of a selection transistor that is connected to the word line during memory cell selection. In this manner, the conductive resistance of this selection transistor is lowered, and a greater readout or write current flows in the selection transistor as compared with a case in which the power voltage is applied to the gate of the selection transistor, whereby high speed data readout and write operations are achieved.

However, by using the increased voltage that is higher than the power voltage, there increases a substrate current that flows in a semiconductor substrate on which the DRAM is formed. In this manner, an increase in hot carrier is produced, and there occurs transistor degradation such as an increased threshold voltage of the transistor or a decrease in conductance.

In order to reduce such transistor degradation due to an increase in hot carrier and extend service life, there has been conventionally adopted a technique for connecting another transistor in series with a transistor to which the increased voltage is applied. The degradation of service life of the transistor due to a hot carrier is closely associated with a substrate current. That is, it is known that, if the substrate current is reduced by one digit, the service life increases by about three digits. The substrate current is represented by an exponential function of a voltage 'Vds' between a source and a drain. Therefore, in order to extend the service life of a transistor, it is most effective to alleviate the voltage conditions and reduce electrical field intensity applied to the transistor. A plurality of transistors are connected in series, whereby a voltage is divided by a plurality of these transistors, and a voltage applied to one transistor is reduced.

In general, an N-channel transistor is weaker than a P-channel transistor relevant to a hot carrier. Because of this, it is effective to connect transistors in series only to the N-channel side in a CMOS configured DRAM at which both of the P-channel and N-channel transistors are provided.

Figure 1:
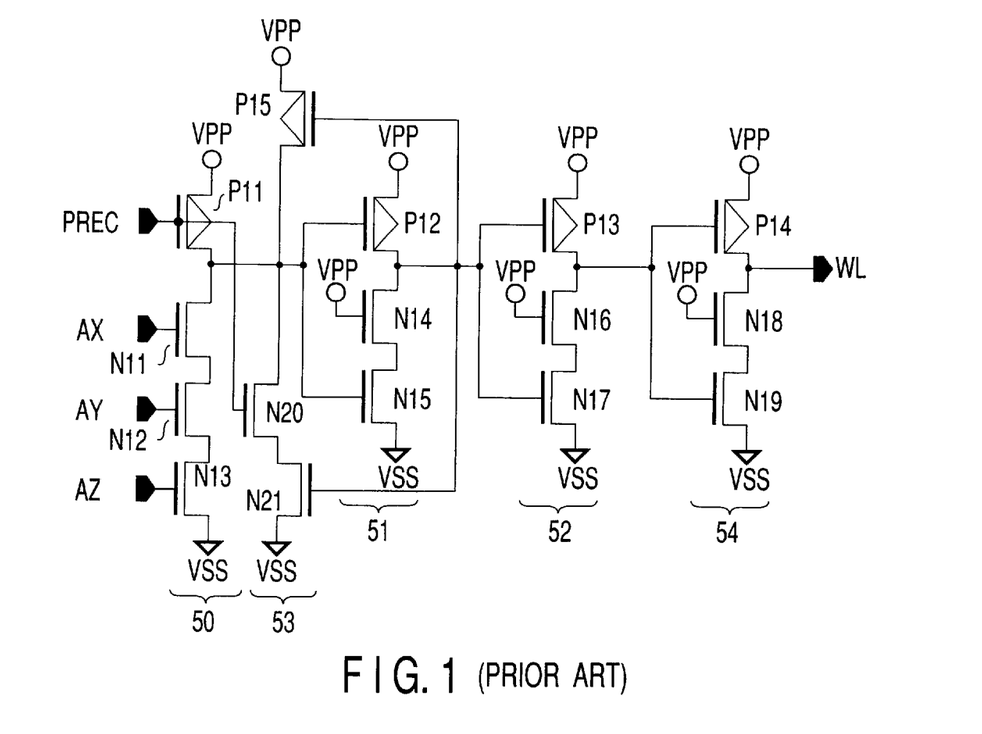
FIG. 1 is a circuit diagram of a conventional row decoder circuit in a CMOS configured DRAM.

FIG. 1 shows an example of a conventional row decoder circuit in the CMOS configured DRAM, the circuit being provided as an example of a semiconductor integrated circuit for which the above described hot carrier countermeasure is taken. In general, in a row decoder circuit, a plurality of decode circuits are arranged in an array manner in order to drive a plurality of word lines WL. Here, only one decode circuit for driving one word line WL is shown.

This row decoder circuit is composed of: a partial decode circuit 50 for decoding an address signal of a plurality of bits; two pre-driver circuits 51 and 52 cascade-connected so as to sequentially invert an output of this partial decode circuit 50; a latch circuit 53 for latching an output of the partial decode circuit 50 and a word line driver circuit 54 for driving the word line WL based on an output of the pre-driver circuit 52 at a final stage.

The partial decode circuit 50 is of a pre-charge/discharge type, and is composed of a P-channel transistor P11 and three N-channel transistors N11 to N13. This partial decode circuit 50 outputs a decode signal based on a plurality of bits, i.e., address signals AX, AY, and AZ of three bits in this example, after a pre-charge period based on the pre-charge signal PREC has completed.

These two pre-driver circuits 51 and 52 are each composed of discrete P-channel transistors P12 and P13, respectively, and two pairs of N-channel transistors N14 and N15 and N-channel transistors N16 and N17, respectively. These circuits sequentially invert and supply outputs of the partial decode circuit 50.

The word line driver circuit 54 is composed of one P-channel transistor P14 and two N-channel transistors N18 and N19. This circuit drives the word line WL upon receipt of an output of the pre-driver circuit 52.

The latch circuit 53 is composed of one P-channel transistor P15 and two N-channel transistors N20 and N21. This latch circuit 53 latches a decode signal according to an original input address signal even after the input address signal level is changed after the pre-charge period in the partial decode circuit 50 has completed, and further, a decode output signal based on the input address signal has been determined. The latch circuit 53 is operatively controlled based on a pre-charge signal PREC and an output of the pre-driver circuit 51.

Here, in order to set the high-level side voltage of a word line drive signal to an increased voltage that is higher than the power voltage, an increased voltage VPP to which a power voltage VCC is increased is applied to each source of each of the respective P-channel transistors in the pre-driver circuits 51 and 52, the latch circuit 53, and the word line driver circuit 54.

In such a configured row decoder circuit, an increased voltage VPP is supplied as a power voltage of each of the pre-driver circuits 51 and 52 and the word line driver circuit 54. Further, in order to reduce the electric field intensity applied to each of the N-channel side of the pre-driver circuits 51 and 52 and the word line driver circuit 54, N-channel transistors N14, N16, and N18, each of which causes the increased voltage VPP to be applied to each gate, are connected in series, respectively, to N-channel transistors N15, N17, and N19.

Figure 2:
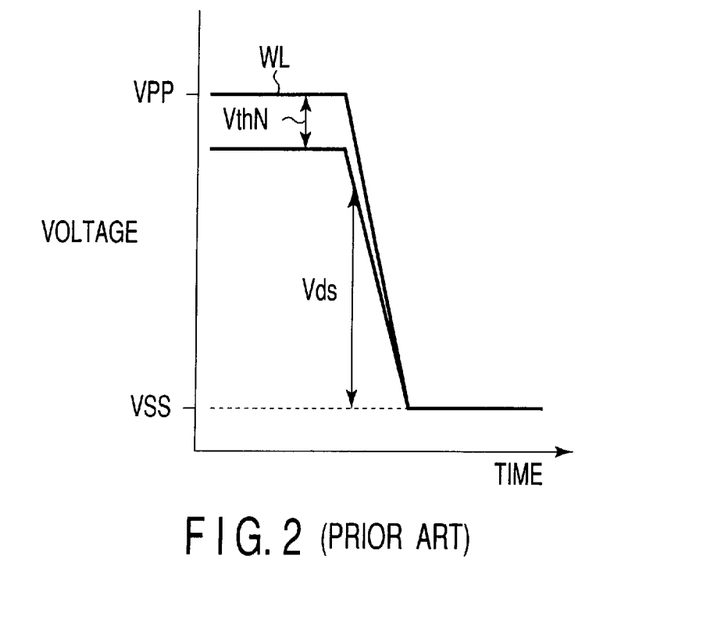
FIG. 2 is a chart showing a voltage waveform of a partial signal in the row decoder circuit of FIG. 1.

In this way, the N-channel transistors N14, N16, and N18, each of which causes the increased voltage VPP to be applied to each gate, are connected in series, respectively, to the N-channel transistors N15, N17, and N19, whereby the maximum value of the voltage applied to the source of each of the N-channel transistors N15, N17, and N19 becomes VPP-VthN (where VthN denotes a threshold value of an N-channel transistor), and a voltage 'Vds' applied between the drain and source of each of the N-channel transistors N15, N17, and N19 is reduced by VthN as compared with the maximum value VPP of the voltage applied to the word line WL, as shown in FIG. 2. In this manner, transistor degradation such as an increased threshold voltage or a decreased conductance based on an increase in substrate current as described previously is restrained.

However, in the word line driver circuit 54, the transistor N18 is connected in series to the N-channel transistor N19. Because of this, if an attempt is made to take a current drive force at the N-channel side so as to be equal to a case in which the transistor N18 is not connected, a total size of the transistors at the N-channel side increases to four times its original size.

If the size of the N-channel side transistor that configures the word line driver circuit 54 increases, a vicious cycle is entered in which the pre-driver circuits 52 and 51, used to drive the enlarged transistor, must also be enlarged, thus increasing the overall transistor size.

For example, when the N-channel side of the word line driver circuit 54 is composed of only one transistor, the channel width of such a transistor is defined as W, and the N-channel side is composed of two transistors connected in series, if an attempt is made to obtain a current drive force equal to a case in which only one transistor is provided, it is required to set the channel width of the two transistors connected in series to 2W, respectively. That is, when hot carrier countermeasures are taken, the total element size of the N-channel side transistors is four times as large as the original size in the word line driver circuit 54.

Typically, the element size of the N-channel side transistor of the pre-driver circuit 52 for driving the word line driver circuit 54 is required to be W/3 where the element size in the word line driver circuit 54 is defined as W, assuming that the circuit is driven by a fan-out 3. Thus, the element size of the N-channel side transistor of the pre-driver circuit 51 for driving this pre-driver circuit 52 is required to be W/9. Further, if the channel width of each of the N-channel transistors in the word line driver circuit 54 is defined as 2W, the channel widths at the two N-channel sides, each of which configures the pre-driver circuit 52, are required to be 2W/3, respectively, and the channel widths at the two N-channel side, each of which configures the pre-driver 51, are required to be 2W/9, respectively.

As a result, the total of the channel widths of the N-channel side transistors in the pre-driver circuits 51 and 52 and the word line driver circuit 54 is $\{2W+(2W/3)+(2W/9)\}\times 2=52W/9\approx 5.78$ W.

In this way, in the conventional row decoder circuit for which hot carrier countermeasures are taken, the circuit layout increases in size as compared with a case in which hot carrier countermeasures are not taken.

In particular, if the hot carrier countermeasures as described above are taken for a row decoder circuit for driving a word line, the length of the decoder circuit is a factor that defines the chip size of the DRAM itself, thus causing a substantial increase in chip size.

In addition, an increase in circuit layout size denotes that power consumption increases accordingly.

BRIEF SUMMARY OF THE INVENTION

If hot carrier countermeasures are taken for conventional semiconductor integrated circuits using such increased high voltages, there occurs a problem that power consumption increases and the chip size is increased.

The present invention has been made in order to solve the foregoing problem. It is an object of the present invention to provide a semiconductor integrated circuit using an increased voltage, wherein an increase in chip size is reduced, and hot carrier countermeasures can be taken without causing a significant increase in power consumption.

According to one aspect of the present invention, there is provided a semiconductor integrated circuit comprising:

a first node to which a first voltage is applied;

a plurality of first transistors of a first channel each having a current path which has one end and the other end and a gate, the one end of the current path being connected to the first node;

a plurality of second nodes to which the other end of the current paths of the plurality of first transistors is connected, respectively;

a plurality of second transistors of a second channel each having a current path which has one end and the other end and a gate, the one end of each of the current path is connected to the second node, respectively;

a third node to which the other ends of the current paths of the plurality of the second transistors are connected in common;

a fourth node to which a second voltage lower than the first voltage is applied; and a third transistor of the second channel having a current path and a gate, wherein the current path is connected between the third node and the fourth node, and a third voltage higher than the second voltage is applied to the gate.

According to another aspect of the present invention, there is provided a semiconductor integrated circuit comprising:

a first node to which a first voltage obtained by increasing a power voltage is applied;

a plurality of decode circuits arranged in an array manner, the plurality of decode circuits each comprising:

a partial decode circuit for decoding an address signal;

pre-driver circuits each having at least one inverter circuit which comprises a first transistor of a P-channel having a source a drain, and a gate, the source being connected to the first node, and a second transistor of an N-channel having a source, a drain and a gate, the drain being connected to a drain of the first transistor, an output of the partial decode circuit being inputted to the gate of each of the first and second transistors; and a word line driver circuit comprises: a third transistor of a P-channel having a source, a drain and a gate, the source being connected to the first node; and a fourth transistor of an N-channel having a source, a drain, and a gate, the drain being connected to a drain of the third transistor, and the source being connected to a source of the second transistor, an output of the pre-driver circuit being supplied to drive a word line;

a second node to which a second voltage lower than the first voltage is applied; and a fifth transistor of an N-channel having a source, a drain, and a gate, a source-drain path is connected between a source common connection node of the second and fourth transistors and the second node, and a third voltage higher than the second voltage is applied to the gate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Hereinafter, the present invention will be described in more detailed by way of example with reference to the accompanying drawings. Like elements in these figures are designated by like reference numerals for clarity.

Figure 3:
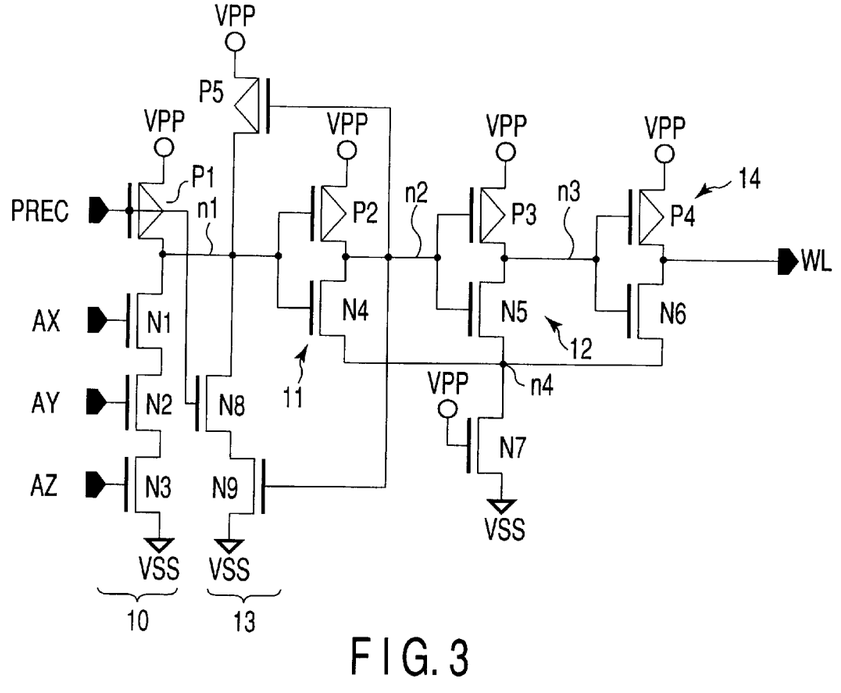
FIG. 3 is a circuit diagram of a row decoder circuit according to a first embodiment of the present invention.

FIG. 3 is a circuit diagram according to a first embodiment in which a semiconductor integrated circuit according to the present invention is implemented for a row decoder circuit in a CMOS configured DRAM. In general, in a row decoder circuit, a plurality of decode circuits are arranged in an array manner. Here, there is shown only one decode circuit for driving one word line WL.

This row decoder circuit is composed of: a partial decode circuit 10 for decoding address signals; two pre-driver circuits 11 and 12 connected in cascade so as to sequentially invert decode outputs of this partial decode circuit 10; a latch circuit 13 for latching a decode output of the partial decode circuit 10; and a word line driver circuit 14 for driving a word line WL based on an output of the pre-driver circuit 12 at the final stage.

The partial decode circuit 10 is of a pre-charge/discharge type. This circuit is composed of: a P-channel transistor P1 in which a source-drain is connected between a node to which an increased voltage VPP obtained by increasing a power voltage VCC is applied and an output node n1; and three N-channel transistors N1 to N3 in which a source-drain is connected in series between the output node n1 and a node to which a grounding voltage VSS of 0 V is applied.

This partial decode circuit 10 outputs a decode signal from the output node n1 based on a plurality of bits, i.e., address signals AX, AY, and AZ in this example, after a pre-charge period based on a pre-charge signal PREC has completed.

The pre-driver circuit 11 is a CMOS configured inverter circuit comprising: a P-channel transistor P2 whose source is connected to a node to which an increased voltage VPP is applied and whose drain is connected to an output node n2; and an N-channel transistor N4 whose drain is connected to the output node n2 and whose gate is connected in common to a gate of the P-channel transistor P2, wherein a gate common connection node of the transistors P2 and P4 is connected to the output node n1 of the partial decode circuit 10.

The pre-driver circuit 12 is a CMOS configured inverter circuit comprising: a P-channel transistor P3 whose source is connected to a node to which an increased voltage VPP is applied and whose drain is connected to an output node n3; and an N-channel transistor N5 whose drain is connected to the output node n3 and whose gate is connected in common to a gate of the P-channel transistor P3, wherein a gate common connection node of the transistors P3 and N5 are connected to the output node n2 of the pre-driver circuit 11.

That is, the above two pre-driver circuits 11 and 12 are connected in cascade so as to sequentially invert an output of the partial decode circuit 10.

The word line driver circuit 14 is a CMOS type inverter circuit comprising: a P-channel transistor P4 whose source is connected to a node to which an increased voltage VPP is applied and whose drain is connected to a word line WL; and an N-channel transistor N6 whose drain is connected to the word line WL and whose gate is connected in common to a gate of the P-channel transistor P4, wherein a gate common connection node of the transistors P4 and N6 are connected to the output node n3 of the pre-driver circuit 12. This word line driver circuit 14 drives a word line WL when an output from the pre-driver circuit 12 is inputted.

Further, the sources of the N-channel transistor N4 in the pre-driver circuit 11, N-channel transistor N5 in the pre-driver circuit 12, and N-channel transistor N6 in the word line driver circuit 14 are connected in common, and a drain of an N-channel transistor N7 for voltage alleviation is connected to this source common connection node n4. The source of this N-channel transistor N7 is connected to a node to which a grounding voltage VSS of 0 V is applied, and an increased voltage VPP is applied to the gate of the transistor N7.

The latch circuit 13 is composed of: a P-channel transistor P5 whose source is connected to a node to which an increased voltage VPP is applied and whose drain is connected to the output node n1 of the partial decode circuit 10; and two N-channel transistors N8 and N9 in which a source-drain is connected in series between the output node n1 and a node to which a grounding voltage VSS of 0 V is applied. The gates of the P-channel transistor P5 and N-channel transistor N9 are connected to the output node n2 of the pre-driver circuit 11, and a pre-charge signal PREC is supplied to a gate of the N-channel transistor N8.

Now, an operation of the above-configured row decoder circuit will be described here. In a pre-charge period in which a pre-charge signal PREC is set to an "L" level, the P-channel transistor P1 in the partial decode circuit 10 is conductive, and its output node n1 is pre-charged to an "H" level that corresponds to an increased voltage VPP.

In a decode period after a pre-charge period has completed, after the pre-charge signal PREC has changed to the "H" level, a decode operation is performed based on three-bit address signals AX, AY, and AZ. For example, if all of the three-bit address signals AX, AY, and AZ are set to the "H" level, this partial decode circuit 10 enters a selection state. Then, all of the three N-channel transistors N1 and N3 are conductive, and the output node n1 pre-charged at the "H" level in advance is discharged to the "L" level.

On the other hand, if at least one of the threebit address signals AX, AY, and AZ is set to the "L" level during a decode period, at least one of the three N-channel transistors N1 to N3 connected in series is non-conductive. In this case, the output node n1 pre-charged at the "H" level is maintained to be pre-charged.

The two pre-driver circuits 11 and 12 connected in cascade sequentially invert outputs of the partial decode circuit 10, and further, the word line driver circuit 14 inverts an output of the pre-driver circuit 12. Thus, when the partial decode circuit 10 is in a selection state, an output of the pre-driver circuit 11 is set to the "H" level; an output of the pre-driver circuit 12 is set to the "L" level; and an output of the word line driver circuit 14 is set to the "H" level, wherein an increased voltage VPP corresponding to the "H" level is outputted to the word line WL.

When the partial decode circuit 10 is in a non-selection state, an output of the pre-driver circuit 11 is set to the "L" level; an output of the pre-driver circuit 12 is set to the "H" level; and an output of the word line driver circuit 14 is set to the "L", wherein a low voltage corresponding to the "L" level is outputted to the word line WL.

After a decode operation in the partial decode circuit 10 has been performed during the decode period, a decode output signal of the partial decode circuit 10 is latched by means of the latch circuit 14. For example, assume that a signal of the output node n1 of the partial decode circuit 10 is set to the "L" level after the decode operation has been performed. This signal of the node n1 is inverted by means of the pre-driver circuit 11, and the signal of the output node n2 is set to the "H" level. Upon receipt of this signal of the node n2, an N-channel transistor N9 in the latch circuit 14 is conductive. At this time, a pre-charge period has already completed, and thus, the pre-charge signal PREC is set to the "H" level, and an N-channel transistor N8 in the latch circuit 14 is conductive. Therefore, the signal of the node n1 is set to the "L" level by means of the latch circuit 14.

In contrast, in the case where a signal of the output bode n2 of the pre-driver circuit 10 is set to the "H" level after the decode operation has been performed, a signal of the output node n2 of the pre-driver circuit 11 is set to the "L" level. Upon receipt of this signal of the node n2, a P-channel transistor P5 in the latch circuit 14 is conductive. Therefore, the signal of the node n1 is set to the "H" level by means of the latch circuit 14.

In this way, after the decode operation has been performed, a signal of the output node n1 of the partial decode circuit 10 is latched by means of the latch circuit 14. Thus, even if the levels of three-bit address signals AX, AY, and AZ change before the next pre-charge period, the selection/non-selection state of the word line WL is not changed.

In the meantime, as described previously, when the partial decode circuit 10 is in an non-selection state, a low voltage of the "L" level is outputted to the word line WL. However, a value of the low voltage that corresponds to this "L" level is determined as follows. A drain-source of the N-channel transistor N7 for voltage alleviation is inserted between a source of the N-channel transistor N6 in the word line driver circuit 14 and a node of the grounding voltage VSS. In addition, an increased voltage VPP is applied to a gate of this N-channel transistor N7. Therefore, this N-channel transistor N7 is conductive.

Now, when the next pre-charge period starts while an increased voltage VPP is outputted to the word line WL; the output node n1 of the partial decode circuit 10 is reset to the "H" level; the output node n2 of the pre-driver circuit 11 is reset to the "L" level; and the output node n3 of the pre-driver circuit 12 is reset to the "H" level, respectively. The N-channel transistor N6 in the word line driver circuit 14, which has been non-conductive, becomes conductive, and a signal voltage of the word line WL begins lowering from VPP.

Figure 4:
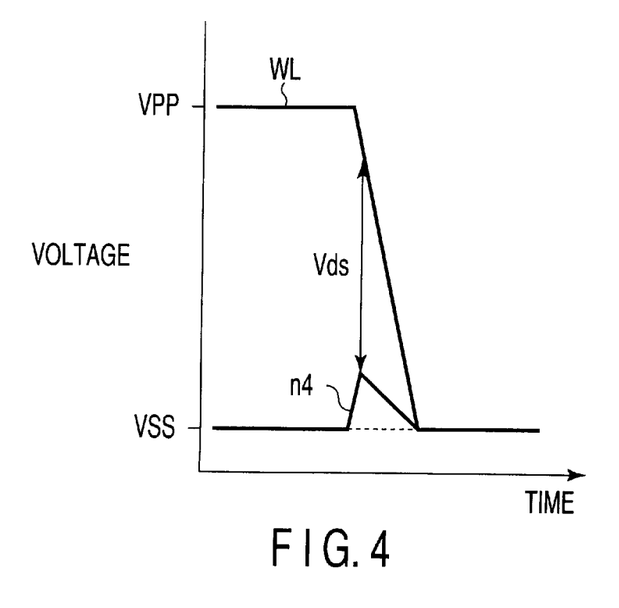
FIG. 4 is a chart showing a voltage waveform of a partial signal in the row decoder circuit of FIG. 3.

At this time, a current flows in the N-channel transistor N7 via the N-channel transistor N6. In general, when a transistor is conductive, a certain degree of conductive resistance exists in a source-drain, depending on the channel width or the like. Therefore, the above current flows, whereby a voltage fall caused by a resistance component occurs with the source-drain of the N-channel transistor N7. As a result, after the N-channel transistor N6 has been conductive, a potential of the node n4 to which the drain of the N-channel transistor N7 is connected slightly rises relevant to the VSS as shown in FIG. 4. As a result, a voltage 'Vds' applied to the source-drain of the N-channel transistor N6 is lowered from a voltage of the word line WL by an increase in potential of the node n4.

The voltage fall caused by the resistance component at the source-drain of the N-channel transistor N7 is determined depending on a value of a current that flows in the transistor N7 or the element size of the transistor N7. This voltage fall is about 0.2 V to 0.3 V, for example.

In this way, in the word line driver circuit 14, when the transistor N6 is conductive, a voltage fall occurs with the source-drain of the transistor N7 connected in series to this transistor N6, and a source voltage of the transistor N6 rises relevant to VSS. Thus, a source-drain voltage 'Vds' of the transistor N6 is lower than VPP.

In addition, in the pre-driver circuits 11 and 12 as well, when the N-channel transistors N4 and N5 are conductive while a signal of each of the output nodes n2 and n3 is set to VPP, and each of the output nodes n2 and n3 is set to a low voltage that corresponds to the "L" level, an ON current flows the N-channel transistor N7 via the N-channel transistor N4 or N5. Thus, as is the case described previously, a voltage fall caused by the resistance component occurs with the source-drain of the N-channel transistor N7. As a result, as is the case with the word line driver circuit 14, after the N-channel transistor N4 or N5 has been conductive, a potential of the node n4 to which a drain of the N-channel transistor N7 is connected slightly rises relevant to VSS, as shown in FIG. 4. In addition, a voltage 'Vds' applied to the source-drain of the N-channel transistor N4 or N5 is lowered by an increase in potential of the node n4.

In this way, in the pre-driver circuits 11 and 12 and the word line driver circuit 14, when the transistor N4, N5 or N6 is conductive, a voltage fall occurs with the source-drain of the transistor N7 connected in series to each of these transistors, and a voltage of the node n4 rises relevant to VSS. Thus, the source-drain voltage 'Vds' of the transistor N4, N5, or N6 is lower than VPP.

As a result, in the row decoder circuit according to the present embodiment, even if an increased voltage higher than a power voltage VCC is used, a voltage applied to the source-drain of the N-channel side transistor (N4, N5, N6) can be lower than VPP. In this manner, transistor degradation such as an increase in threshold voltage or decrease in conductance based on an increase in substrate current is restrained, and the service life of the transistor can be extended.

Moreover, in the row decoder circuit of the embodiment shown in FIG. 3, one transistor N7 being an N-channel transistor for voltage alleviation is provided in common relevant to the pre-driver circuit 11 and 12 and the word line driver circuit 14.

As in the conventional case, assume that each of the N-channel sides of the pre-driver circuits 11 and 12 and the word line driver circuit 14 is composed of only one transistor; a channel width of the N-channel transistor in the word line driver circuit 14 is defined as W; a channel width of the N-channel transistor in the pre-driver circuit 12 is defined as W/3; and a channel width of the N-channel transistor in the pre-driver circuit 11 is defined as W/9. At this time, if an attempt is made to obtain a current drive force equal to that of each of these transistors in the row decoder circuit of FIG. 3, a channel width of the N-channel transistor N7 connected between the node n4 and a node of the grounding voltage VS may be {W+(W/3)+(W/9)}.

That is, a total of the channel widths of the N-channel side transistors in the pre-driver circuits 11 and 12 and the word line driver circuit 14 is obtained as {W+(W/3)+(W/9)}×2= 26 W/9≈2.88 W, which can be reduced to about 50% as compared with 5.78 W of the conventional circuit shown in FIG. 1.

As a result, the circuit layout can be sufficiently reduced in size as compared with the conventional row decoder circuit for which hot carrier countermeasures are taken.

In addition, the circuit layout is reduced in size, whereby power consumption can be reduced.

Figure 5:
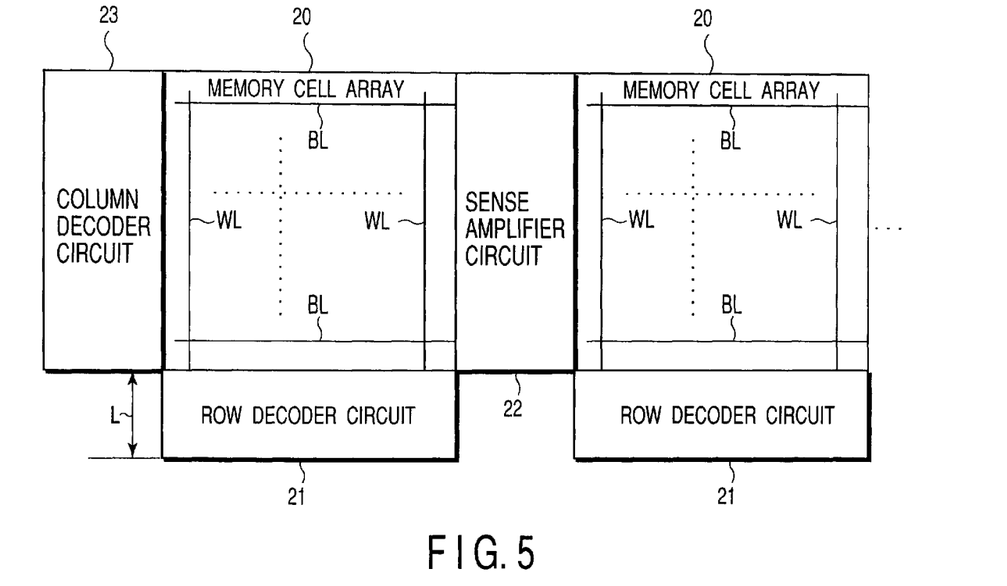
FIG. 5 is a block diagram showing a configuration of a core portion in a general DRAM.

FIG. 5 is a block diagram depicting a configuration of a memory core portion of a general DRAM. Reference numerals 20, 20 . . . are memory arrays in which a plurality of memory cells are arranged in a matrix manner, respectively. In each of these memory cell arrays 20, a plurality of word lines WL and a plurality of bit lines BL are arranged so as to cross each other. In addition, a memory cell is arranged at a crossing point between each of the word lines WL and each of the bit lines BL.

The word lines WL in each memory cell array 20 are driven by individual row decoder circuits 21, 21, . . . provided adjacent to each memory cell array 20. In addition, a sense amplifier circuit 22 for sensing data read out in the bit line BL is arranged between two mutually adjacent memory cell arrays 20 among a plurality of memory cell arrays 20. The sense amplifier circuit 22 is shared by these two memory arrays 20 adjacent to each other.

Further, one column decoder circuit 23 is provided relevant to a plurality of memory cell arrays 20. This column decoder circuit 23 is arranged adjacent to one memory cell array 20.

Here, in each of the row decoder circuits 21, a plurality of decode circuits shown in FIG. 3 are provided, and the plurality of these decode circuits are arranged in an array manner. If the circuit layout of each of these decoder circuits increases in size, a length of the row decoder 21 indicated by 'L' in FIG. 5 increases. This length L in the row decoder 21 is a factor that defines the chip size of the DRAM itself. Thus, in the DRAM of FIG. 3 in which the circuit layouts of the individual decoder circuits can be reduced in size, the above length L can be reduced further than convention, whereby the chip size of the DRAM chip can be reduced.

Now, a second embodiment of the present invention will be described here.

Figure 6:
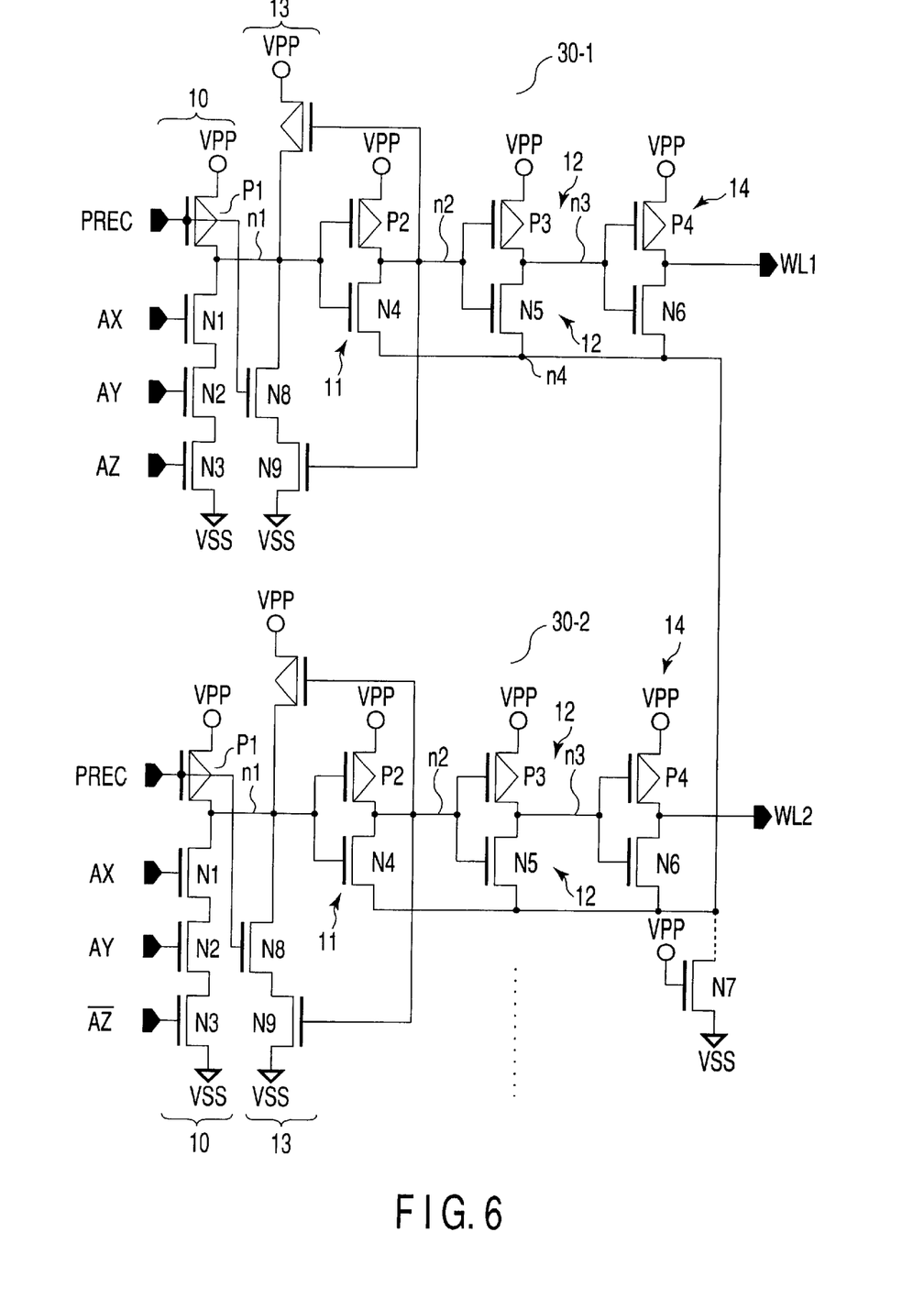
FIG. 6 is a circuit diagram of a row decoder circuit according to a second embodiment of the present invention.

FIG. 6 is a circuit diagram according to the second embodiment in which a semiconductor integrated circuit according to the present invention is implemented for a row decoder circuit in a CMOS configured DRAM.

As described previously, in a row decoder circuit, a plurality of decode circuits are provided corresponding to a plurality of word lines WL, and these decode circuits are arranged in an array manner. In the low decode circuit of FIG. 6, there is shown two decode circuits 30-1 and 30-2 for driving two word lines WL1 and WL2.

Here, address signals AX, AY, and AZ are inputted to the N-channel transistors N1, N2, and N3 in the partial decode circuit 10 of the decode circuit 30-1 for driving one word line WL1. Address signals AX, AY, and /AZ (/AZ denotes an opposite level of AZ) are inputted to the N-channel transistors N1, N2, and N3 in the partial decode circuit 10 of the decode circuit 30-2 for selectively driving the other word line WL2. In addition, combinations of address signals that differ from the address signals AX, AY, and AZ and the address signals AX, AY, and /AZ inputted to the above two decode circuits 30-1 and 30-2 are inputted, respectively, to the N-channel transistors N1, N2, and N3 in the partial decode circuit 10 of another decode circuit 30 (not shown).

In this row decoder circuit, the output node n1 of each partial decode circuit 10 is pre-charged at the "H" level during a pre-charge period before decoding address signals. At this time, the output node n2 of each pre-driver circuit 11 is set to the "L" level, the output node n3 of each pre-driver circuit 12 is set to the "H" level, and the output of each word line driver circuit 14 is set to the "L" level. Then, only the output node n1 of the selected partial decode circuit 10 is discharged at the "L" level based on the address signals, only the output of the word line driver circuit 14 in that decode circuit is set to the "H" level, and the corresponding word line is driven.

Therefore, all of the N-channel transistors N1, N2, and N3 of a plurality of decode circuits 30 are conductive from the "H" level state for a pre-charge period, and there exists only one output node n1 to which a set of address signals is inputted, the output node entering the "L" level.

Because of this, in the row decoder circuit of the embodiment shown in FIG. 6, only one N-channel transistor N7 for voltage alleviation is provided in common relevant to a plurality of decode circuits 30.

In this case, a channel width of the N-channel transistor N7 for voltage alleviation may be {W+(W/3)+(W/9)} as in the case with FIG. 3. Thus, there can be achieved an advantageous effect that the circuit layout can be further reduced in size as compared with a case in which N-channel transistor N7 for voltage alleviation is provided relevant to each of a plurality of the decode circuits 30.

Now, third and fourth embodiments of the present invention will be described here.

Although a case in which an increased voltage VPP is applied to a gate of the N-channel transistors N7 for voltage alleviation has been described in the above first and second embodiments, a voltage higher than a grounding voltage VSS, for example, a power voltage VCC may be applied instead of the increased voltage VPP.

Figure 7:
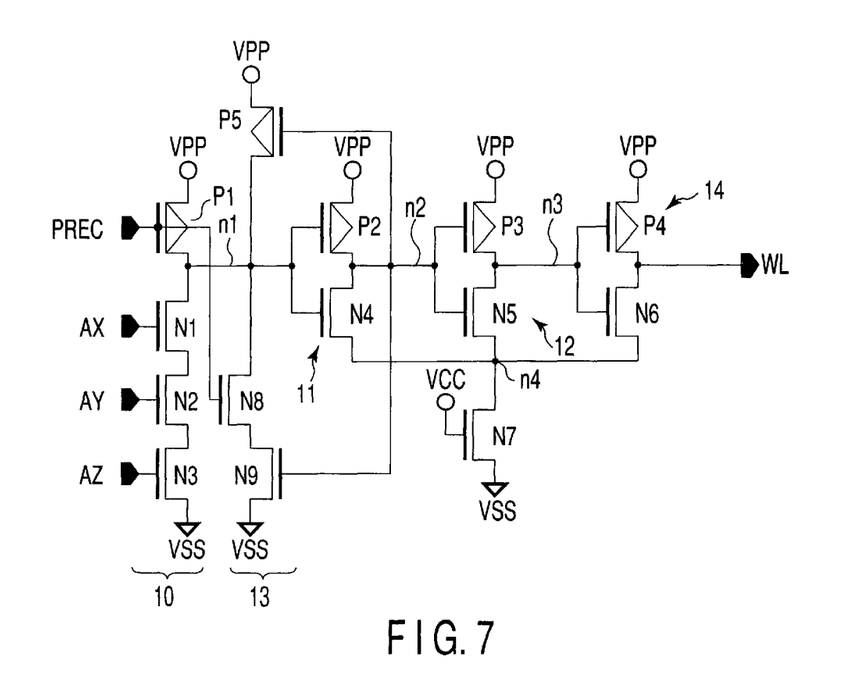
FIG. 7 is a circuit diagram of a row decoder circuit according to a third embodiment of the present invention.
Figure 8:
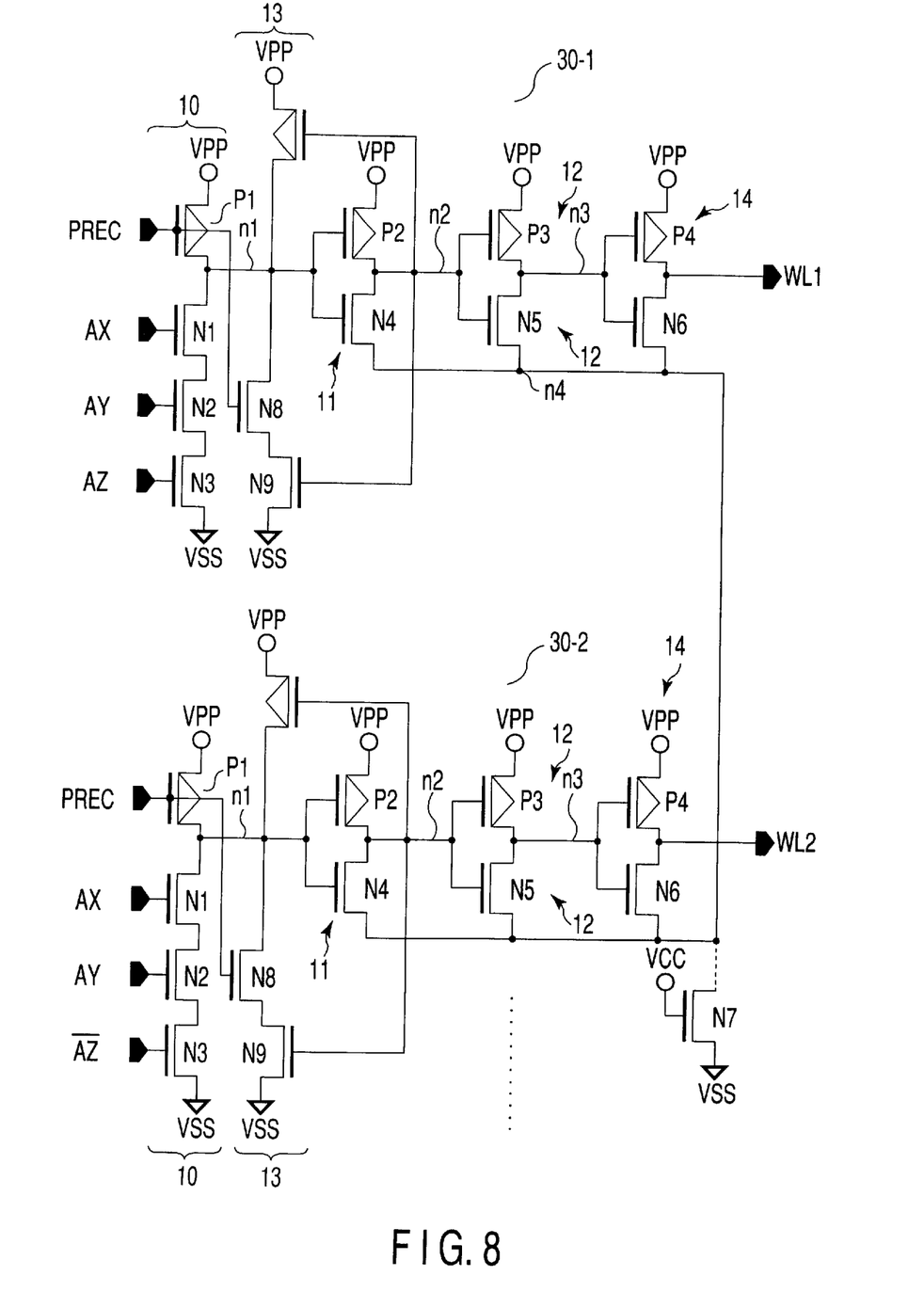
FIG. 8 is a circuit diagram of a row decoder circuit according to a fourth embodiment of the present invention.

FIG. 7 shows a configuration of a row decoder circuit according to the third embodiment that corresponds to the first embodiment shown in FIG. 3. In the third embodiment, a power voltage VCC is applied to a gate of the N-channel transistor N7 for voltage alleviation. Similarly, FIG. 8 shows a configuration of a row decoder circuit according to the fourth embodiment that corresponds to the second embodiment shown in FIG. 6. In this fourth embodiment, a power voltage VCC is applied to a gate of the N-channel transistors N7 for voltage alleviation.

In this way, in the case where the power voltage VCC is applied to the gate of the N-channel transistor N7 for voltage alleviation, the current drive force of this transistor N7 is weaker than a case in which the increased voltage VPP is applied. A voltage of the node n4 when this transistor N7 is conductive further rises from VSS. In this manner, the voltage conditions for each of the respective N-channel transistors N4, N5, and N6 are further alleviated, and hot carrier countermeasures become more effective.

Figure 9:
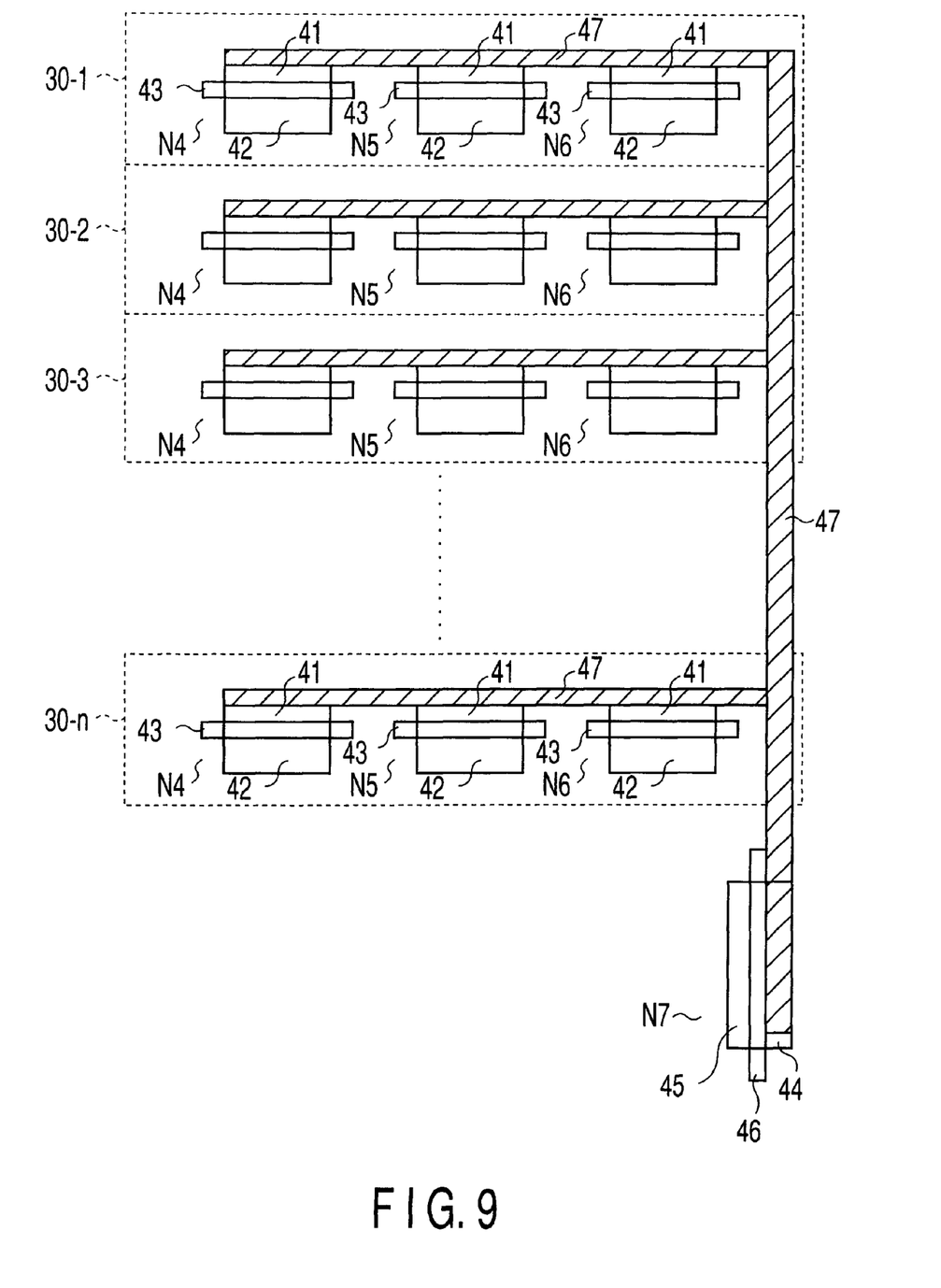
FIG. 9 is a pattern plan view showing an example of the transistor arrangement state of the row decoder circuit shown in FIG. 6 and FIG. 8.

FIG. 9 is a pattern plan view showing an example of an arrangement state of the N-channel transistors N4, N5, and N6 and the N-channel transistor N7 for voltage alleviation in a plurality of the decode circuits 30-1 to 30-n arranged in an array manner in the row decoder circuit according to the second and fourth embodiments shown in FIGS. 6 and 8.

In FIG. 9, reference numerals 41, 41 denote source diffusion regions that are sources of the N-channel transistors N4, N5, and N6; reference numerals 42, 42 denote drain diffusion regions that are drains of the N-channel transistors N4, N5, and N6; and reference numerals 43, 43, 43 denote gate electrodes that are gates of the N-channel transistors N4, N5, and N6. Reference numeral 44 denotes a drain region of the N-channel transistor N7; reference numeral 45 denotes a source region of the N-channel transistor N7; and reference numeral 46 denotes a gate electrode of the N-channel transistor N7.

Here, all of the source diffusion regions 41 of the N-channel transistors N4, N5, and N6 in each decode circuit 30-are electrically connected to the drain region 44 of the N-channel transistor N7 by means of a metal wiring 47.

The N-channel transistor N7 for voltage alleviation is arranged at a position distant from a plurality of decode circuits 30-1 to 30-n arranged in an array manner. The extension direction (channel width direction) of the gate electrodes 43 of the N-channel transistors N4, N5, and N6 in each decode circuit 30-1 to 30-n crosses that of the gate electrode 46 of the N-channel transistor N7 for voltage alleviation.

Figure 10:
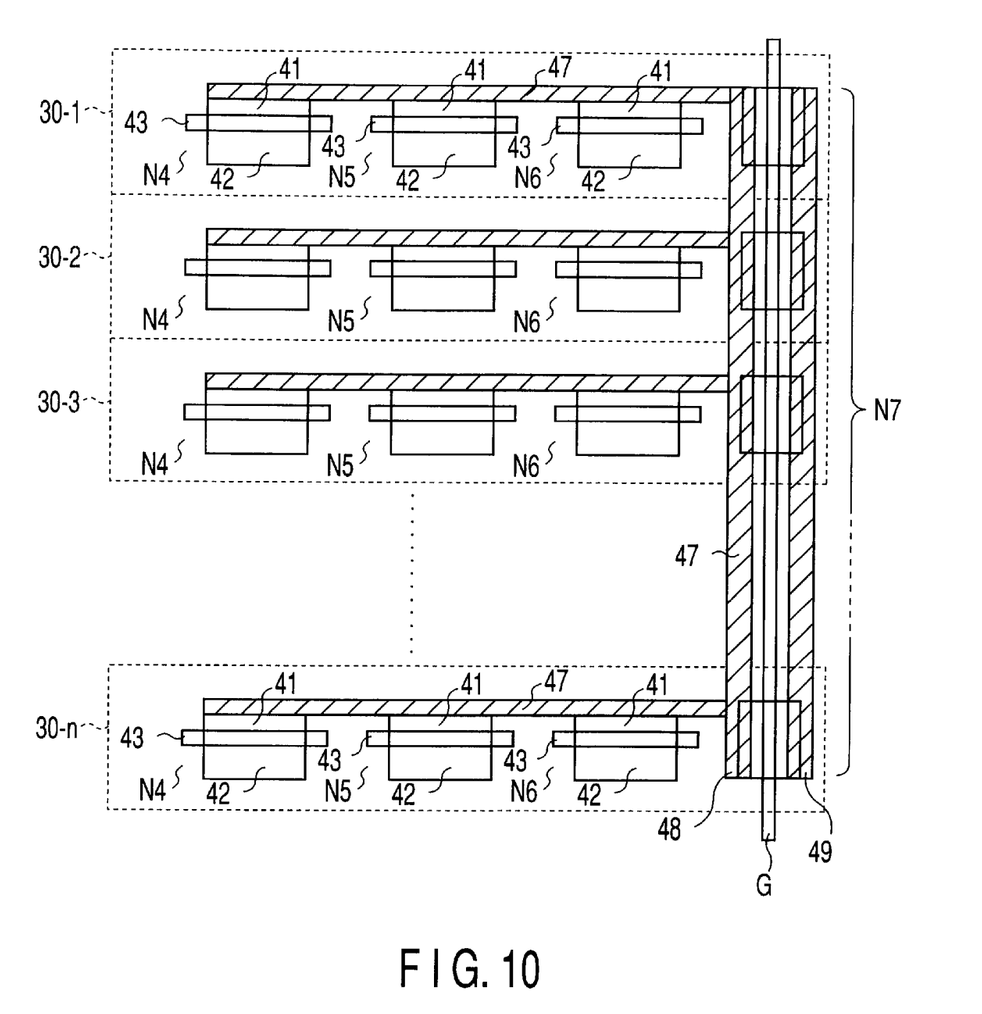
FIG. 10 is a pattern plan view showing another example of a transistor arrangement state of the row decoder circuit shown in FIG. 6 and FIG. 8.

FIG. 10 is a pattern plan view showing another example of arrangement state of the N-channel transistors N4, N5, and N6 and the N-channel transistor N7 for voltage alleviation in a plurality of decode circuits 30-1 to 30-n arranged in an array manner in the row decoder circuit according to the second and fourth embodiments shown in FIGS. 6 and 8. Like elements in FIG. 9 are designated by like reference numbers for clarity.

In FIG. 9, the transistor 7 for voltage alleviation has been formed and arranged as one transistor at a position distant from a plurality of decode circuits 30-1 to 30-n arranged in an array manner. In contrast, in the case of FIG. 10, the transistor N7 for voltage alleviation is composed of a plurality of transistors with small element size, and a plurality of these transistors with small element size are arranged to be dispersed at a plurality of decode circuits 30-1 to 30-n arranged in an array manner.

In FIG. 10, reference numeral 48 denotes a metal wiring for electrically connecting the drain regions of a plurality of the transistors arranged to be dispersed to each other; and reference numeral 49 denotes a metal wiring for electrically connecting the source regions of the transistors, where the above metal wiring 48 is electrically connected to the metal wiring 47.

In this case as well, the extension direction (channel width direction) of the gate electrodes 43 of the N-channel transistors N4, N5, and N6 in each of the decode circuits 30-1 to 30-n crosses that of a gate electrode G of the N-channel transistor N7 for voltage alleviation.

The present invention is not limited to the above embodiments, and, various modifications can readily be made. For example, although each of the above embodiments describe a case in which the sources of the N-channel transistors N3, N7, and N9 are connected to the node of the grounding voltage VSS, these sources may be connected to a node to which a negative voltage is applied instead of the node of the grounding voltage VSS.

Figure 11:
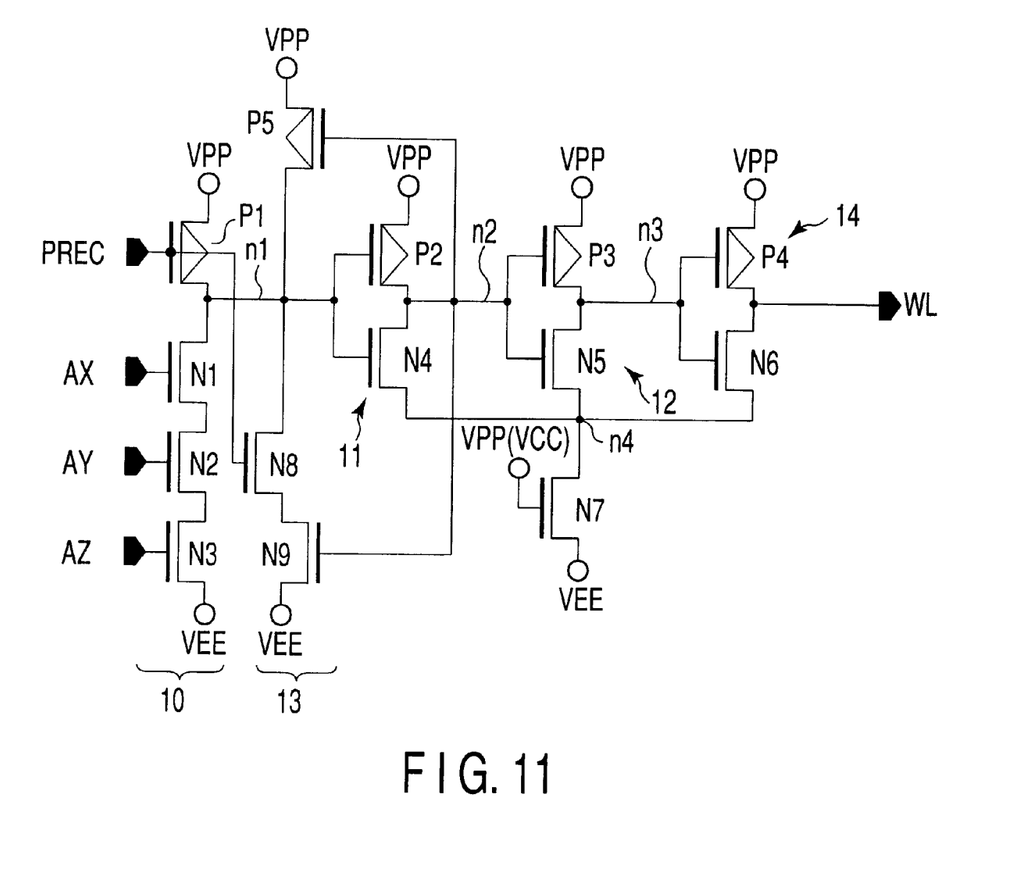
FIG. 11 is a circuit diagram depicting a modified example of a row decoder circuit according to the first embodiment.

FIG. 11 is a circuit diagram of a modified row decoder circuit according to the first embodiment shown in FIG. 3, where the sources of the above N-channel transistors N3, N7, and N9 are connected to a node to which a negative voltage VEE is applied. In the case of the present embodiment, either the increased voltage VPP or power voltage VCC is supplied to a gate of the N-channel transistor N7.

Figure 12:
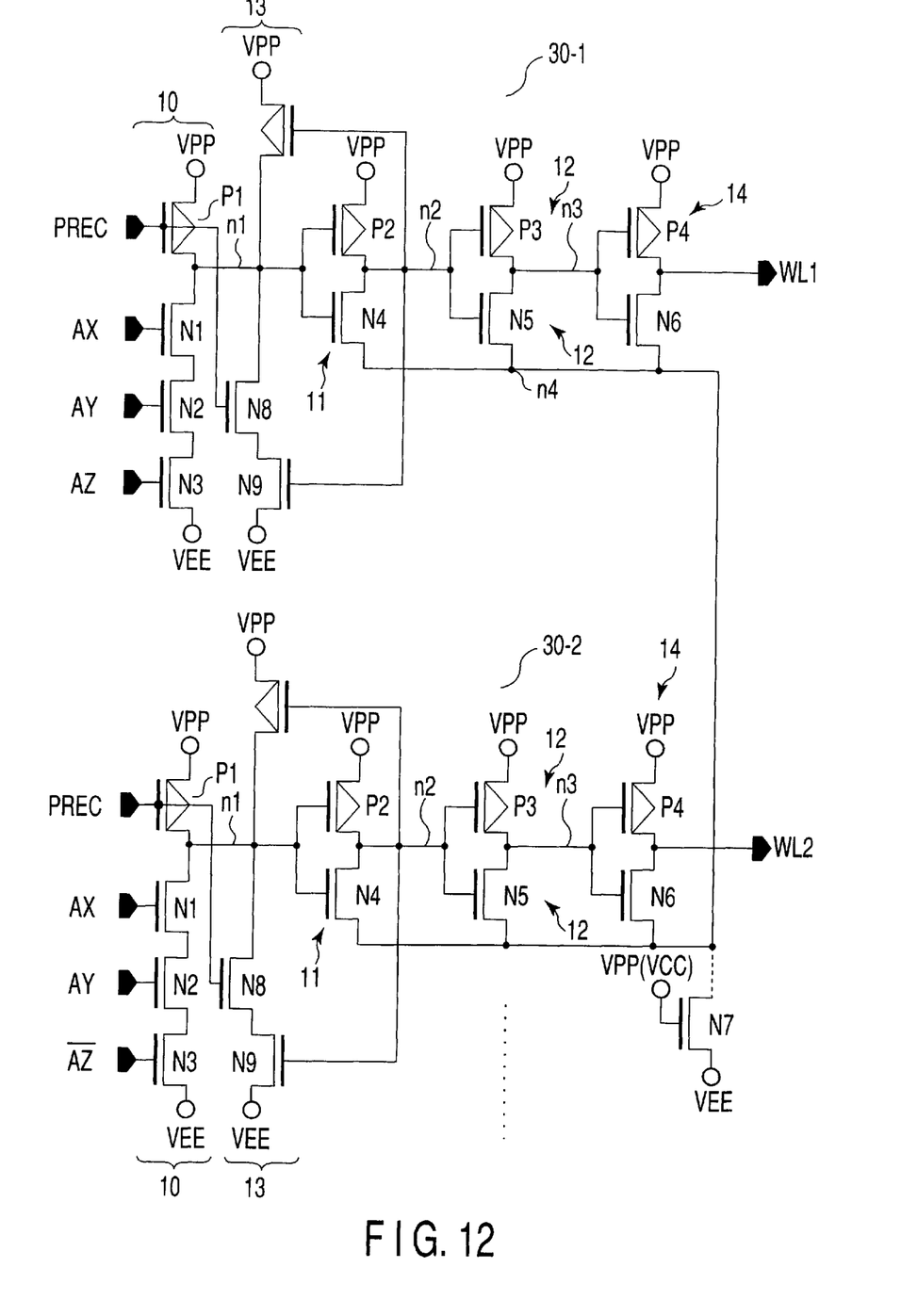
FIG. 12 is a circuit diagram depicting a modified example of a row decoder circuit according to the second embodiment.

Similarly, FIG. 12 is a circuit diagram of a modified row decoder circuit according to the second embodiment shown in FIG. 6, where the sources of the above N-channel transistors N3, N7, and N9 are connected to a node to which a negative voltage VEE is applied. In the case of the present embodiment as well, either the increased voltage VPP or power voltage VCC is supplied to the gate of the N-channel transistor N7.

In addition, although each of the above embodiments describe a case in which a source of the P-channel transistor P4 in the word line driver circuit 14 is connected to a node to which the increased voltage VPP is applied, the increased voltage VPP is decoded according to address signals that differ from the previously described three-bit row address signals AX, AY, and AZ so that the increased voltage VPP obtained as this decode output may be supplied to the source of the P-channel transistor P4 in the word line driver circuit 14.

As has been described above, according to the present invention, there can be provided a semiconductor integrated circuit that operates at an increased high voltage, wherein an increase in chip size is restrained, and hot carrier countermeasures can be taken without a significant increase in power consumption.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor integrated circuit comprising:
a first node to which a first voltage is applied;

a plurality of first transistors of a first channel each having a current path which has a first end and a second end and a gate, the first end of the current path being connected to the first node;

a plurality of second nodes to which the second end of the current paths of the plurality of the first transistors is connected, respectively;

a plurality of second transistors of a second channel each having a current path which has a first end and a second end and a gate, the first end of the current path is connected to one of the second nodes, respectively;

a third node to which the second ends of the current paths of the plurality of second transistors are connected in common;

a fourth node to which a second voltage lower than the first voltage is applied;

a third transistor of the second channel having a current path and a gate, the current path is connected between the third node and the fourth node, and a third voltage higher than the second voltage is applied to the gate; and wherein the first, second, and third voltages are constant voltages.

2. The semiconductor integrated circuit according to claim 1, wherein the first channel is a P-channel, and the second channel is an N-channel.

3. The semiconductor integrated circuit according to claim 1, wherein the first voltage is an increased voltage obtained by increasing a power voltage.

4. The semiconductor integrated circuit according to claim 1, wherein the third voltage is a voltage equal to the first voltage.

5. The semiconductor integrated circuit according to claim 3, wherein the third voltage is a voltage equal to the power voltage.

6. The semiconductor integrated circuit according to claim 1, wherein a signal produced by decoding a plurality of address signals is supplied to at least one gate of the plurality of the first or second transistors.

7. The semiconductor integrated circuit according to claim 1, wherein the second voltage is a negative voltage.

8. A semiconductor integrated circuit comprising:

a first node to which a first voltage obtained by increasing a power voltage is applied;

a plurality of decode circuits arranged in an array, the plurality of decode circuits each comprising:

a partial decode circuit for decoding address signals;

pre-driver circuits each having at least one inverter circuit which comprises a first transistor of a P-channel having a source, a drain, and a gate, the source being connected to the first node, and a second transistor of an N-channel having a source, a drain and a gate, the drain of the second transistor being connected to a drain of the first transistor, an output of the partial decode circuit being inputted to the gate of each of the first and second transistors; and a word line driver circuit comprises a third transistor of a P-channel having a source, a drain and a gate, the source of the third transistor being connected to the first node, and a fourth transistor of an N-channel having a source, a drain, and a gate, the drain of the fourth transistor being connected to a drain of the third transistor, and the source of the fourth transistor being connected to a source of the second transistor, an output of the pre-driver circuit being supplied to the word line drive circuit;

a second node to which a second voltage lower than the first voltage is applied;

a fifth transistor of an N-channel having a source, a drain, and a gate, a source-drain path is connected between a common source connection node of the second and fourth transistors and the second node, and a third voltage higher than the second voltage is applied to the gate;

wherein the first, second, and third voltages are constant voltages.

9. The semiconductor integrated circuit according to claim 8, wherein the first voltage is an increased voltage obtained by increasing a power voltage.

10. The semiconductor integrated circuit according to claim 8, wherein the third voltage is a voltage equal to the first voltage.

11. The semiconductor integrated circuit according to claim 9, wherein the third voltage is a voltage equal to the power voltage.

12. The semiconductor integrated circuit according to claim 8, wherein the second voltage is a negative voltage.

13. The semiconductor integrated circuit according to claim 8, wherein the fifth transistor is arranged at a position different from the plurality of decode circuits arranged in the array.

14. The semiconductor integrated circuit according to claim 8, wherein the fifth transistor is disposed on each of decode circuits arranged in the array.

* * * * *